(12) United States Patent
Teng et al.

(10) Patent No.: US 8,242,769 B2
(45) Date of Patent: Aug. 14, 2012

(54) METHOD FOR MEASURING TRANSCONDUCTANCE

(75) Inventors: Cheng-Yung Teng, Taipei County (TW); Mine-Yuan Huang, Taipei (TW)

(73) Assignee: Princeton Technology Corporation, Taipei County (TW)

( * ) Notice: Subject to any disclaimer, the term of this patent is extended or adjusted under 35 U.S.C. 154(b) by 384 days.

(21) Appl. No.: 12/640,409

(22) Filed: Dec. 17, 2009

(65) Prior Publication Data
US 2010/0164481 A1 Jul. 1, 2010

(30) Foreign Application Priority Data
Dec. 30, 2008 (TW) .............................. 97151367 A

(51) Int. Cl.
*G01R 19/18* (2006.01)
*G01R 31/08* (2006.01)
(52) U.S. Cl. ........................................ 324/120; 324/525
(58) Field of Classification Search .................. None
See application file for complete search history.

(56) References Cited

U.S. PATENT DOCUMENTS

| | | | | |
|---|---|---|---|---|
| 6,958,646 B1 * | 10/2005 | Colleran et al. | ................. | 330/9 |
| 7,193,264 B2 * | 3/2007 | Lande | ........................... | 257/314 |
| 7,339,384 B2 * | 3/2008 | Peng et al. | .................... | 324/686 |

* cited by examiner

*Primary Examiner* — Vinh Nguyen
(74) *Attorney, Agent, or Firm* — Muncy, Geissler, Olds & Lowe, PLLC

(57) ABSTRACT

A method for measuring transconductance of an oscillating circuit is provided. The oscillating circuit includes an inverter. When an input terminal and an output terminal of the inverter are floated, the bias voltage of the inverter is obtained by measuring the output terminal thereof. Based on floating the input terminal and respectively providing a first voltage and a second voltage to the output terminal, a first current corresponding to the first voltage and a second current corresponding to the second voltage are measured from the output terminal. The first voltage and the bias voltage have the same voltage levels. An output resistor value of the inverter is obtained according to the first and second voltages and the first and second currents. The transconductance of the oscillating circuit is obtained according to the output resistor value.

16 Claims, 8 Drawing Sheets

US 8,242,769 B2

METHOD FOR MEASURING TRANSCONDUCTANCE

CROSS REFERENCE TO RELATED APPLICATIONS

This Application claims priority of Taiwan Patent Application No. 097151367, filed on Dec. 30, 2008, the entirety of which is incorporated by reference herein.

BACKGROUND OF THE INVENTION

1. Field of the Invention

The invention relates to a method for measuring transconductance parameter, and more particularly to a method for measuring transconductance parameter of an oscillating circuit which comprises an inverter.

2. Description of the Related Art

An oscillating circuit with an inverter is one kind of oscillating circuit implemented in integrated circuits. Referring to FIG. 1A, FIG. 1A shows an oscillating circuit 100. The oscillating circuit 100 comprises a feedback resistor Rf and an inverter 110, both coupled between an input terminal OSCI and an output terminal OSCO. FIG. 1B shows a schematic diagram of the oscillating circuit 100 of FIG. 1A, and FIG. 1C shows a small-signal equivalent circuit of the oscillating circuit 100 of FIG. 1A. In FIG. 1B, the inverter 110 comprises a P type metal oxide semiconductor (MOS) transistor 120 and an N type MOS transistor 130, wherein the P type transistor 120 is coupled between a supply voltage VCC and the output terminal OSCO, and the N type transistor 130 is coupled between a ground GND and the output terminal OSCO. In FIG. 1C, a resistor rdsP and a current source gmP×Vgs show a small-signal model of the P type transistor 120, and a resistor rdsN and a current source gmN×Vgs show a small-signal model of the N type transistor 130, wherein gmP is transconductance of the P type transistor 120 and gmN is transconductance of the N type transistor 130.

FIG. 2 shows a conventional measuring circuit for an oscillating circuit 210 with an inverter, wherein the measuring circuit is used to measure transconductance parameter of the oscillating circuit which is referred to as gm. For an oscillating circuit with an inverter, the transconductance parameter may influence oscillating performance. As shown in FIG. 2, an alternating current (AC) voltage source 220 is coupled to an input terminal OSCI of the oscillating circuit 210 via a capacitor C1. Furthermore, a loading resistor RL is coupled to an output terminal OSCO of the oscillating circuit 210 via a capacitor C2. When the AC voltage source 220 provides an AC input voltage Vi to the oscillating circuit 210, an output voltage Vo corresponding to the AC input voltage Vi may be obtained from the loading resistor RL. Therefore, the transconductance parameter of the oscillating circuit 210 can be given by the following equation (1):

$$gm = \frac{\frac{Vo}{RL}}{Vi}. \quad (1)$$

Moreover, the transconductance parameter of the oscillating circuit 210 is also a sum of the transconductances of the PMOS and NMOS transistors, i.e. gm=gmP+gmN.

However, using an AC measuring method to measure transconductance parameter of an oscillating circuit may increase measuring time and testing cost. Therefore, a DC measuring method for measuring transconductance parameter of an oscillating circuit is desired.

BRIEF SUMMARY OF THE INVENTION

Methods for measuring transconductance of an oscillating circuit are provided, wherein the oscillating circuit comprises an inverter. An exemplary embodiment of such a method for measuring transconductance of an oscillating circuit which comprises an inverter is provided. By floating an input terminal and an output terminal of the inverter and measuring the output terminal, a bias voltage is obtained. By floating the input terminal and respectively providing a first voltage and a second voltage to the output terminal, a first current corresponding to the first voltage and a second current corresponding to the second voltage are measured from the output terminal. The first voltage and the bias voltage have the same voltage levels. An output resistor value of the inverter is obtained according to the first voltage, the second voltage, the first current and the second current. The transconductance of the oscillating circuit is obtained according to the output resistor value.

Furthermore, another exemplary embodiment of a method or measuring transconductance of an oscillating circuit is provided, wherein the oscillating circuit comprises an inverter with an input terminal and an output terminal and a resistor coupled between the input terminal and the output terminal. By floating the input terminal and the output terminal and measuring the output terminal, a bias voltage is obtained. By grounding the output terminal and respectively providing a first voltage and a second voltage to the input terminal, a first current corresponding to the first voltage and a second current corresponding to the second voltage are measured from the input terminal. A resistor value of the resistor is obtained according to the first voltage, the second voltage, the first current and the second current. By floating the input terminal and respectively providing a third voltage and a fourth voltage to the output terminal, a third current corresponding to the third voltage and a fourth current corresponding to the fourth voltage are measured from the output terminal. A first output resistor value of the inverter is obtained according to the third voltage, the fourth voltage, the third current and the fourth current. By providing a fifth voltage to the input terminal and respectively providing a sixth voltage and a seventh voltage to the output terminal, a sixth current corresponding to the sixth voltage and a seventh current corresponding to the seventh voltage are measured from the output terminal. A second output resistor value of the inverter is obtained according to the sixth voltage, the seventh voltage, the sixth current and the seventh current. The transconductance of the oscillating circuit is obtained according to the resistor value, the first output resistor value and the second output resistor value.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
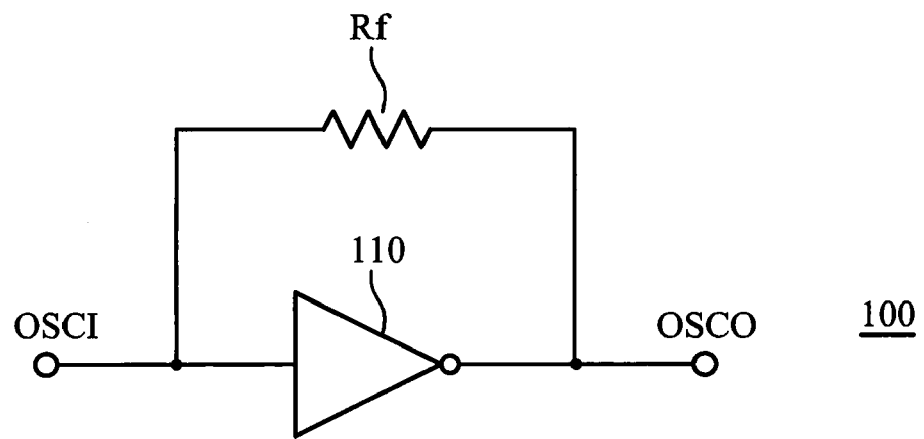
FIG. 1A shows an oscillating circuit.
Figure 1B:
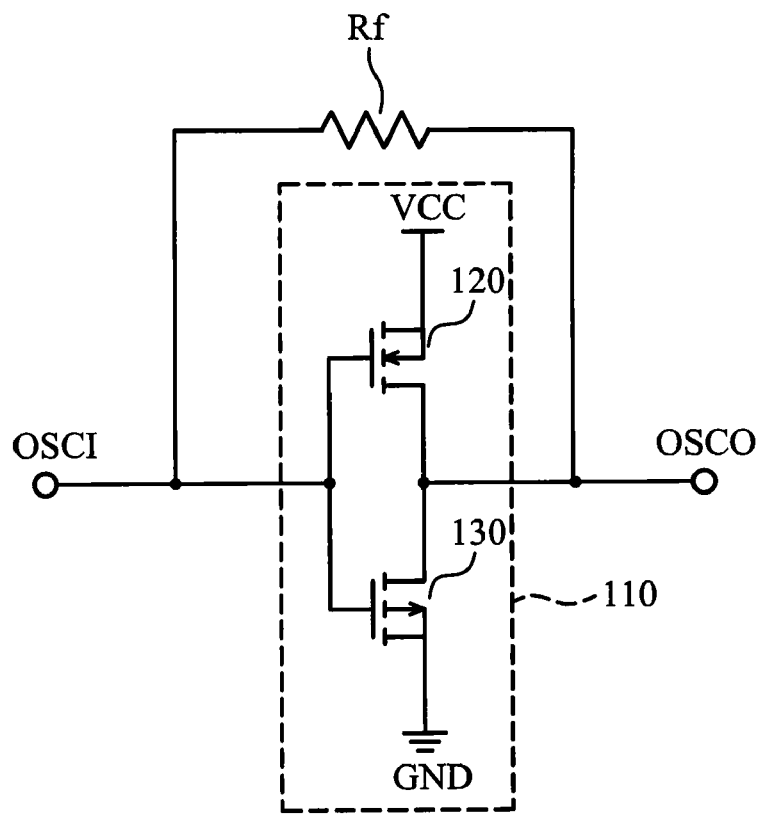
FIG. 1B shows a schematic diagram of the oscillating circuit of FIG. 1A.
Figure 1C:
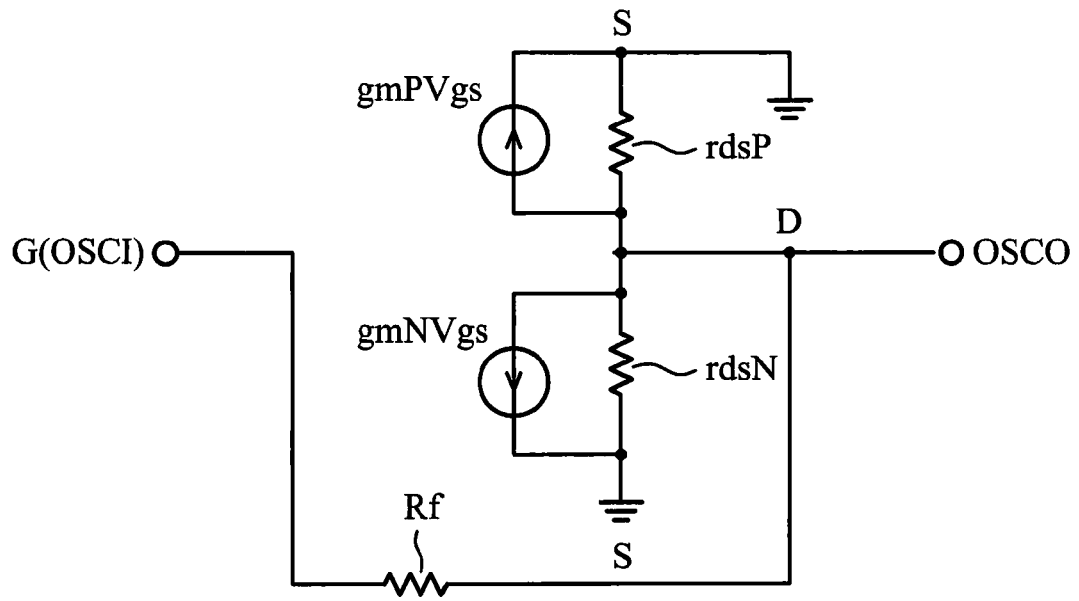
FIG. 1C shows a small-signal equivalent circuit of the oscillating circuit of FIG. 1A.
Figure 2:
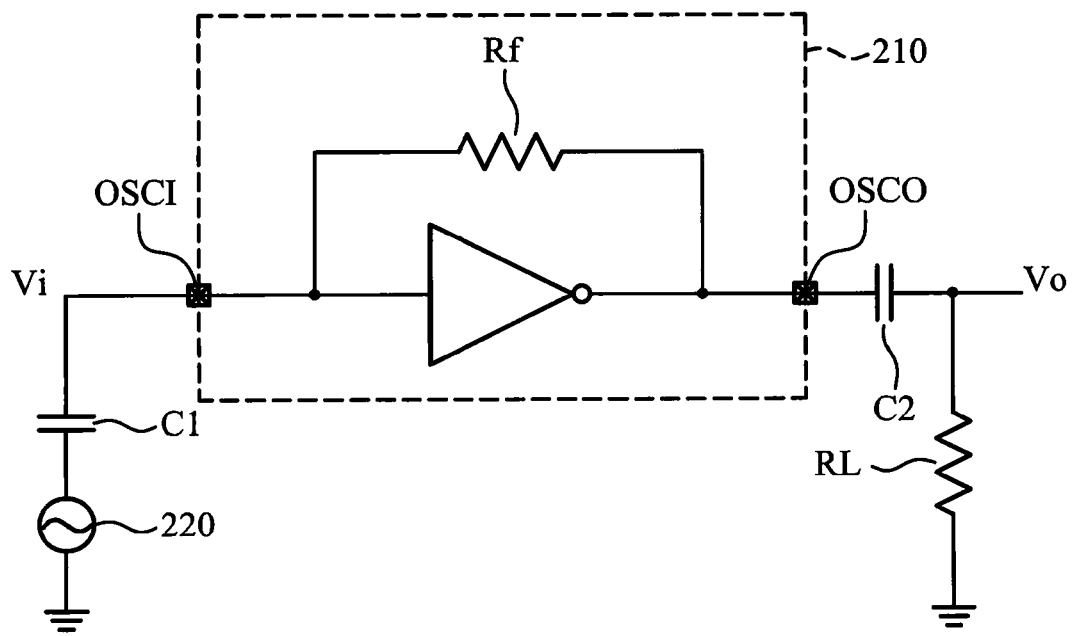
FIG. 2 shows a conventional measuring circuit for an oscillating circuit 210 with an inverter.
Figure 3:
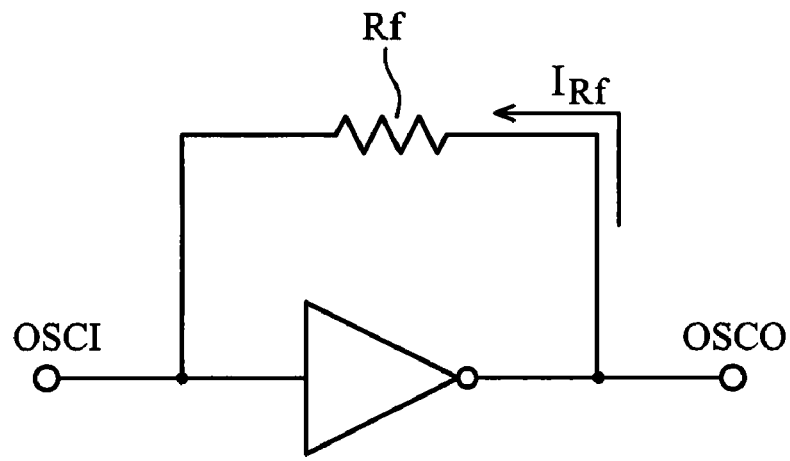
FIG. 3 shows a measuring circuit for measuring a bias voltage of the oscillating circuit according to an embodiment of the invention.

FIG. 3 to FIG. 6 show the measuring circuits for measuring transconductance of an oscillating circuit which comprises an inverter according to an embodiment of the invention. FIG. 3 shows a measuring circuit for measuring a voltage value of a bias voltage $V_{bias}$ of the oscillating circuit. First, an input terminal OSCI and an output terminal OSCO of the inverter are floated. Next, a voltage of the output terminal OSCO is measured to obtain the bias voltage $V_{bias}$. In FIG. 3, the voltages of the input terminal OSCI and the output terminal OSCO have the same voltage levels, $V_{bias}$, due to a zero current $I_{Rf}$ flowing through the resistor Rf.

Figure 4:
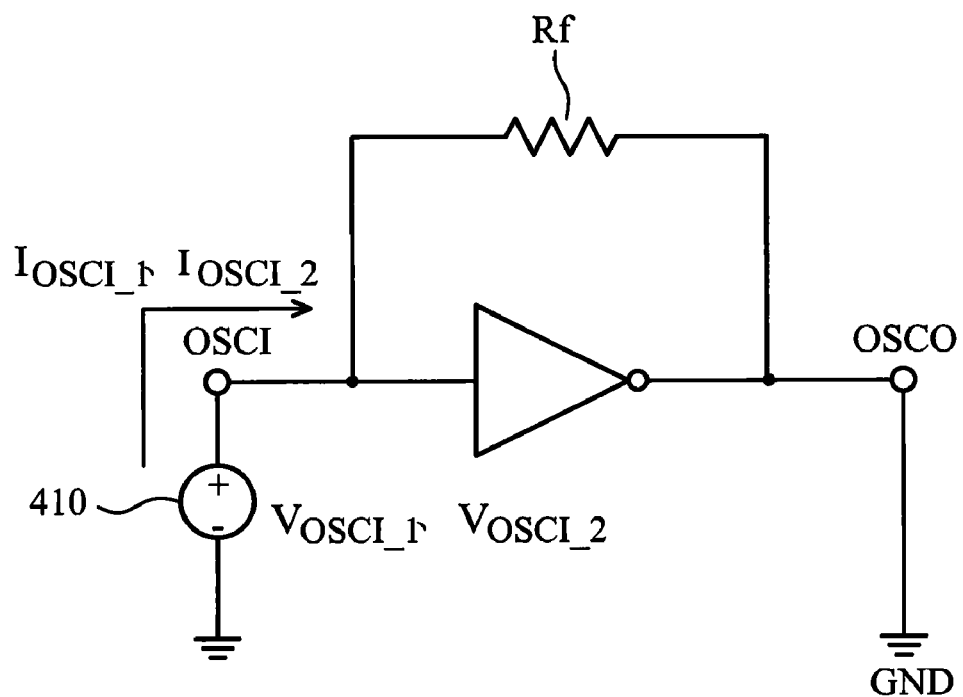
FIG. 4 shows a measuring circuit for measuring a resistor value of the resistor Rf of the oscillating circuit according to an embodiment of the invention.

FIG. 4 shows a measuring circuit for measuring a resistor value of the resistor Rf of the oscillating circuit. As shown in FIG. 4, a direct current (DC) voltage source 410 is coupled to the input terminal OSCI to provide a DC voltage to the oscillating circuit. The output terminal OSCO is coupled to a ground GND. First, the DC voltage source 410 may provide a voltage $V_{OSCI\_1}$ to the input terminal OSCI, so as to measure a current $I_{OSCI\_1}$ corresponding to the voltage $V_{OSCI\_1}$ from the input terminal OSCI, wherein $V_{OSCI\_1} = V_{bias}$. Next, the DC voltage source 410 may provide a voltage $V_{OSCI\_2}$ to the input terminal OSCI, so as to measure a current $I_{OSCI\_2}$ corresponding to the voltage $V_{OSCI\_2}$ from the input terminal OSCI, wherein $V_{OSCI\_2} = V_{bias} + \Delta V_1$ and $\Delta V_1$ is a small voltage (e.g. $\Delta V_1 = 0.1$ V) such that the voltage $V_{OSCI\_2}$ is substantially close to the voltage $V_{OSCI\_1}$. Therefore, the resistor value of the resistor Rf may be given by the following equation (2):

$$Rf = \frac{V_{OSCI\_2} - V_{OSCI\_1}}{I_{OSCI\_2} - I_{OSCI\_1}} = \frac{\Delta V_1}{I_{OSCI\_2} - I_{OSCI\_1}}. \quad (2)$$

Figure 5A:
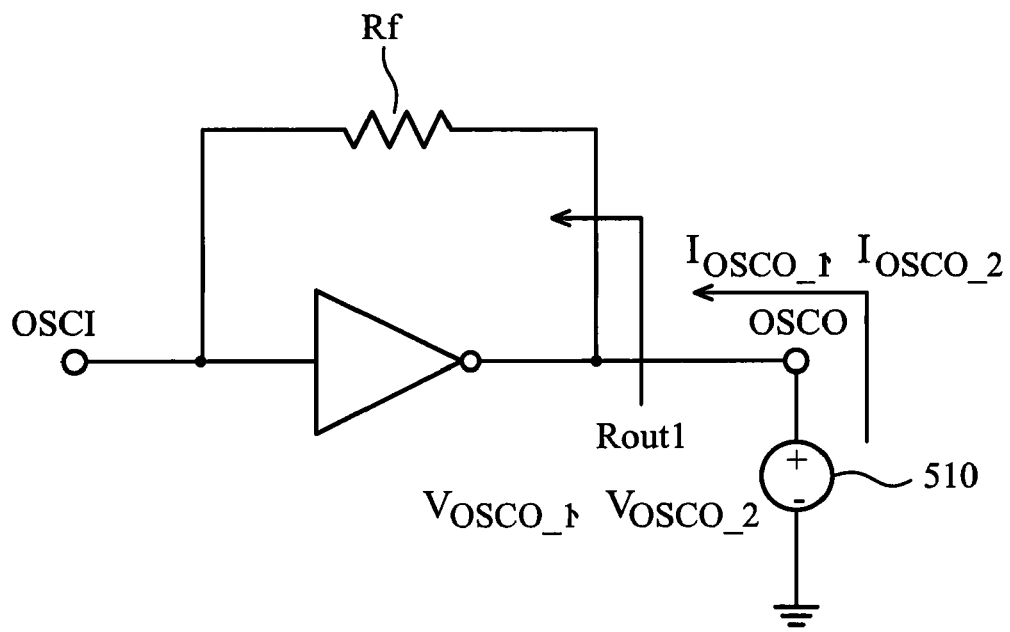
FIG. 5A shows a measuring circuit for measuring an output resistor of the oscillating circuit according to an embodiment of the invention.
Figure 5B:
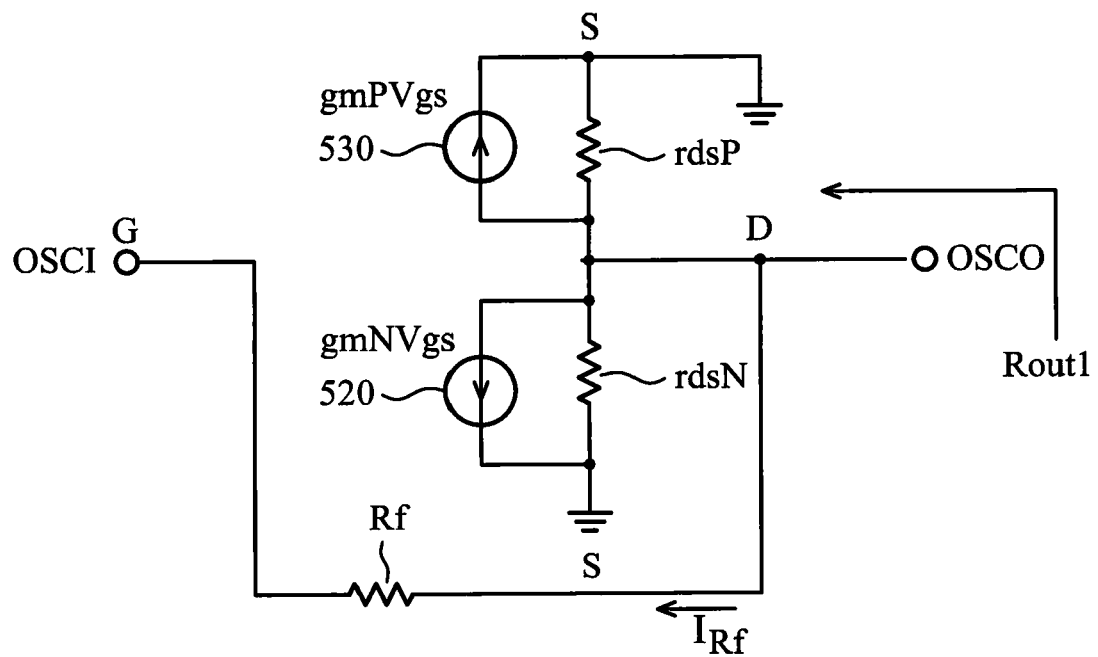
FIG. 5B shows a small-signal equivalent circuit of the measuring circuit in FIG. 5A.

FIG. 5A shows a measuring circuit for measuring an output resistor of the oscillating circuit, and FIG. 5B shows a small-signal equivalent circuit of the measuring circuit in FIG. 5A. As shown in FIG. 5A, a DC voltage source 510 is coupled to the output terminal OSCO to provide a DC voltage to the oscillating circuit. In addition, the input terminal OSCI is floated. First, the DC voltage source 510 may provide a voltage $V_{OSCO\_1}$ to the output terminal OSCO, so as to measure a current $I_{OSCO\_1}$ corresponding to the voltage $V_{OSCO\_1}$ from the output terminal OSCO, wherein $V_{OSCO\_1} = V_{bias}$. Next, the DC voltage source 510 may provide a voltage $V_{OSCO\_2}$ to the output terminal OSCO, so as to measure a current $I_{OSCO\_2}$ corresponding to the voltage $V_{OSCO\_2}$ from the output terminal OSCO, wherein $V_{OSCO\_2} = V_{bias} + \Delta V_2$ and $\Delta V_2$ is a small voltage (e.g. $\Delta V_2 = 0.1$ V) that the voltage $V_{OSCO\_2}$ is substantially close to the voltage $V_{OSCO\_1}$. Therefore, a resistor value of an output resistor Rout1 may be given by the following equation (3):

$$Rout1 = \frac{V_{OSCO\_2} - V_{OSCO\_1}}{I_{OSCO\_2} - I_{OSCO\_1}} = \frac{\Delta V_2}{I_{OSCO\_2} - I_{OSCO\_1}}. \quad (3)$$

Referring to FIG. 5B, due to zero current $I_{Rf}$ flowing through the resistor Rf, the voltages of the input terminal OSCI and the output terminal OSCO have the same voltage levels, i.e. the voltage of a gate G is equal to that of a drain D. Therefore, a relation of gmN×Vgs=gmN×Vds=gmN×Vd is obtained for a current source 520, which indicates that the current source 520 has a resistor character and its resistor value is $$\frac{1}{gmN}.$$

Similarly, a relation of gmP×Vgs=gmP×Vds=gmP×Vd is obtained for a current source 530, which indicates that the current source 530 has a resistor character and its resistor value is $$\frac{1}{gmP}.$$

As shown in FIG. 5B, the output resistor Rout1 can be regarded as an equivalent parallel resistor of a resistor rdsP, a resistor rdsN, the current source 520 and the current source 530, as shown in the following equation (4):

$$Rout1 = \frac{1}{gmN} // \frac{1}{gmP} // rdsN // rdsP. \quad (4)$$

Figure 6A:
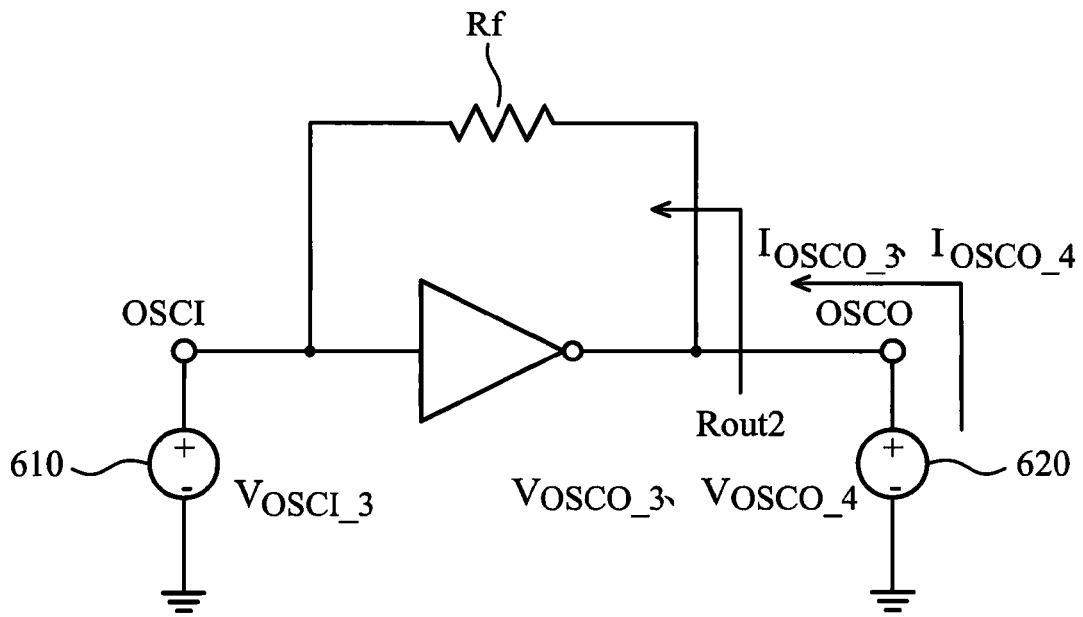
FIG. 6A shows another measuring circuit for measuring an output resistor of the oscillating circuit according to an embodiment of the invention.
Figure 6B:
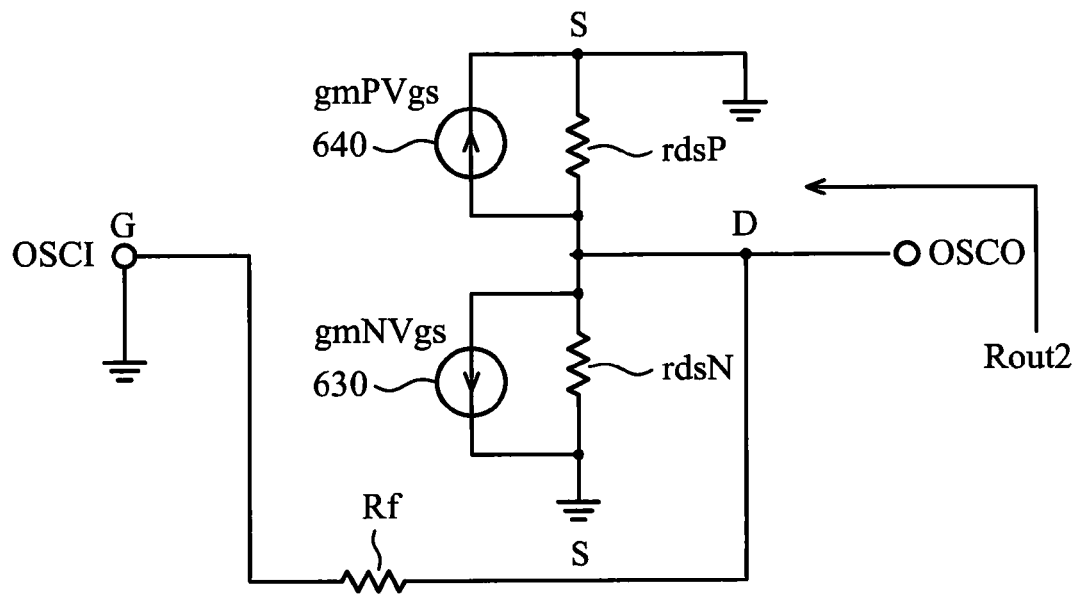
FIG. 6B shows a small-signal equivalent circuit of the measuring circuit in FIG. 6A.

FIG. 6A shows another measuring circuit for measuring an output resistor of the oscillating circuit, and FIG. 6B shows a small-signal equivalent circuit of the measuring circuit in FIG. 6A. As shown in FIG. 6A, a DC voltage source 610 and a DC voltage source 620 are separately coupled to the input terminal OSCI and the output terminal OSCO, and provide the DC voltages to the oscillating circuit. First, the DC voltage source 610 may provide a voltage $V_{OSCI\_3}$ to the input terminal OSCI and the DC voltage source 620 may provide a voltage $V_{OSCO\_3}$ to the output terminal OSCO, so as to measure a current $I_{OSCO\_3}$ corresponding to the voltages $V_{OSCI\_3}$ and $V_{OSCO\_3}$ from the output terminal OSCO, wherein $V_{OSCI\_3}=V_{OSCO\_3}=V_{bias}$. Next, the DC voltage source 610 may provide the voltage $V_{OSCI\_3}$ to the input terminal OSCI and the DC voltage source 620 may provide a voltage $V_{OSCO\_4}$ to the output terminal OSCO, so as to measure a current $I_{OSCO\_4}$ corresponding to the voltages $V_{OSCI\_3}$ and $V_{OSCO\_4}$ from the output terminal OSCO, wherein $V_{OSCO\_4}=V_{bias}+\Delta V_3$ and $\Delta V_3$ is a small voltage (e.g. $\Delta V_3=0.1V$) such that the voltage $V_{OSCO\_4}$ substantially close to the voltage $V_{OSCO\_3}$. In addition, a measuring error caused by a voltage reference offset error between the DC voltage sources 610 and 620 will be cancelled due to the voltages $V_{OSCO\_3}$ and $V_{OSCO\_4}$ being relative voltages from the same voltage source 620. Therefore, a resistor value of an output resistor Rout2 can be given by the following equation (5):

$$Rout2 = \frac{V_{OSCO\_4} - V_{OSCO\_3}}{I_{OSCO\_4} - I_{OSCO\_3}} = \frac{\Delta V_3}{I_{OSCO\_4} - I_{OSCO\_3}}. \quad (5)$$

Referring to FIG. 6B, in the small-signal model, a voltage of the gate G is kept at a fixed voltage of the bias voltage $V_{bias}$, thus gate G is analogous to couple to a ground. When the gate G and a source S are coupled to the ground, the current sources 630 and 640 may form the open circuit, i.e. disconnection. Therefore, the output resistor Rout2 can be regarded as an equivalent parallel resistor of the resistor rdsP, the resistor rdsN and the resistor Rf, as shown in the following equation (6):

$$Rout2 = rdsN // rdsP // Rf \quad (6).$$

The actual values of the bias voltage $V_{bias}$, the resistor Rf and the output resistors Rout1 and Rout2 may be obtained through various measuring circuits, as described above. Moreover, according to a parallel formula of resistors, the following equation (7) may be given as:

$$a // b = \frac{a \times b}{a+b} \quad (7)$$
$$\Rightarrow a \times b = a(a // b) + b(a // b)$$
$$\Rightarrow a[b - (a // b)] = b(a // b)$$
$$\Rightarrow a = \frac{b(a // b)}{[b - (a // b)]},$$

Where symbol "a" represents a first resistor and symbol "b" represents a second resistor. According to the equation (7), the first resistor "a", which is equal to $$\frac{b(a // b)}{[b - (a // b)]}$$

is obtained when the first resistor "a" is parallel to the second resistor "b" (i.e. a//b). Assuming that the first resistor "a" is an equivalent parallel resistor of the resistors rdsP and rdsN (i.e. "a"rdsN//rdsP) and the second resistor "b" is the resistor Rf, an equivalent parallel resistor value of the resistors rdsP and rdsN may be obtained according to the equations (6) and (7), as shown in the following equation (8):

$$rdsN // rdsP = \frac{Rf \times (rdsN // rsdP // Rf)}{Rf - (rdsN // rsdP // Rf)} = \frac{Rf \times Rout2}{Rf - Rout2}. \quad (8)$$

Next, assuming that the first resistor "a" is an equivalent parallel resistor of the resistors $$\frac{1}{gmN} \text{ and } \frac{1}{gmP} \left( \text{i.e. "a"} = \frac{1}{gmN} // \frac{1}{gmP} \right)$$

and the second resistor "b" is an equivalent parallel resistor of the resistors rdsP and rdsN (i.e. "b"=rdsN//rdsP), an equivalent parallel resistor value of the resistors $$\frac{1}{gmN} \text{ and } \frac{1}{gmP}$$

may be obtained according to the equations (4) and (7), as shown in the following equation (9):

$$\frac{1}{gmN} // \frac{1}{gmP} = \frac{(rdsN // rdsP) \times \left( \frac{1}{gmN} // \frac{1}{gmP} // rdsN // rdsP \right)}{(rdsN // rdsP) - \left( \frac{1}{gmN} // \frac{1}{gmP} // rdsN // rdsP \right)} = \quad (9)$$

$$\frac{(rdsN // rdsP) \times Rout1}{(rdsN // rdsP) - Rout1}.$$

Next, transconductance parameter gm of the oscillating circuit may be obtained according to the equations (8) and (9), as shown in the following equation (10):

$$gm = gmN + gmP = \quad (10)$$

$$\frac{1}{\frac{1}{gmN} // \frac{1}{gmP}} = \frac{(rdsN // rdsP) - Rout1}{(rdsN // rdsP) \times Rout1} = \frac{\frac{Rf \times Rout2}{Rf - Rout2} - Rout1}{\frac{Rf \times Rout2}{Rf - Rout2} \times Rout1}.$$

Therefore, the measuring values of the resistor Rf and the output resistors Rout1 and Rout2 may be substituted into the equation (10) to obtain the transconductance parameter gm of the oscillating circuit.

Referring back to FIG. 5B, when the resistor value of the current source 520

$$\left( \text{i.e. } \frac{1}{gmN} \right)$$

is far smaller than that of the resistor rsdN and the resistor value of the current source 530

$$\left( \text{i.e. } \frac{1}{gmP} \right)$$

is far smaller than that of the resistor rsdP, the output resistor Rout1 of the equation (4) may be rewritten as the following equation (11):

$$Rout1 = \frac{1}{gmN} // \frac{1}{gmP} // rdsN // rdsP \cong \frac{1}{gmN} // \frac{1}{gmP}. \quad (11)$$

According to the equation (11), the equation (10) may be rewritten as the following equation (12):

$$gm = gmN + gmP = \frac{1}{\frac{1}{gmN} // \frac{1}{gmP}} = \frac{1}{Rout1} \quad (12)$$

Therefore, when a resistor value of a current source is far smaller than that of a resistor in a small-signal model for a transistor, the transconductance parameter of the oscillating circuit is obtained by substituting the measuring value of the output resistor Rout1 into the equation (12) without measuring the resistor Rf and the output resistor Rout2, thereby speeding up measurement.

Figure 7:
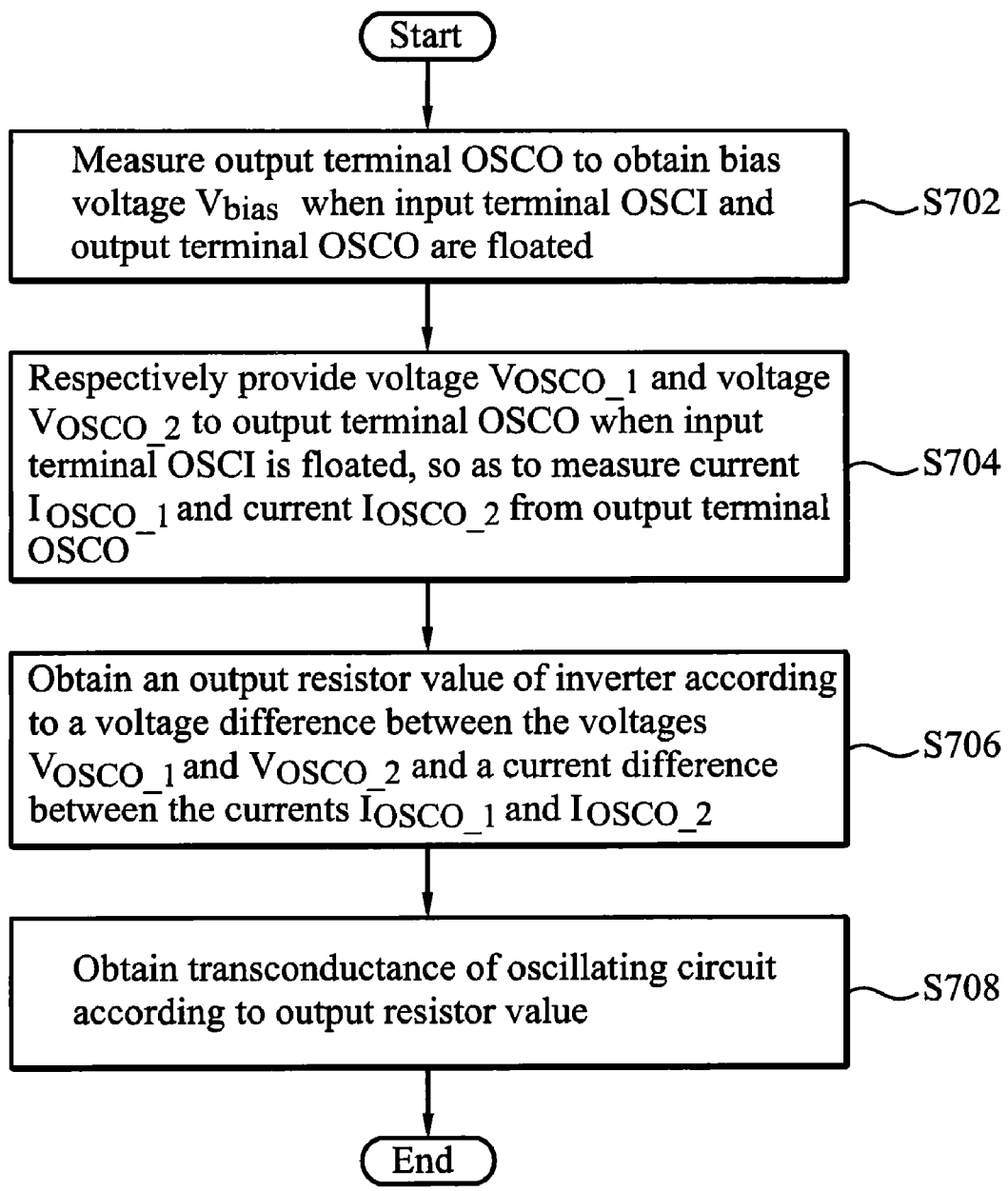
FIG. 7 shows a method for measuring transconductance of an oscillating circuit according to an embodiment of the invention.

FIG. 7 shows a method for measuring transconductance of an oscillating circuit according to an embodiment of the invention, wherein the oscillating circuit comprises an inverter. First, in step S702, a bias voltage $V_{bias}$ of the oscillating circuit is obtained by floating an input terminal OSCI and an output terminal OSCO of the oscillating circuit and measuring the output terminal OSCO. Next, in step S704, by floating the input terminal OSCI and respectively providing the voltages $V_{OSCO\_1}$ and $V_{OSCO\_2}$ to the output terminal OSCO, a current $I_{OSCO\_1}$ corresponding to the voltage $V_{OSCO\_1}$ and a current $I_{OSCO\_2}$ corresponding to the voltage $V_{OSCO\_2}$ are measured from the output terminal OSCO, as shown in FIG. 5A, wherein the voltage $V_{OSCO\_1}$ and the bias voltage $V_{bias}$ have the same voltage levels. Next, in step S706, an output resistor value of the oscillating circuit is obtained according to a voltage difference between the voltages $V_{OSCO\_1}$ and $V_{OSCO\_2}$ and a current difference between the currents $I_{OSCO\_1}$ and $I_{OSCO\_2}$, as shown in the equation (3). Next, in step S708, the transconductance of the oscillating circuit is obtained according to the output resistor value, as shown in equation (12).

Figure 8A:
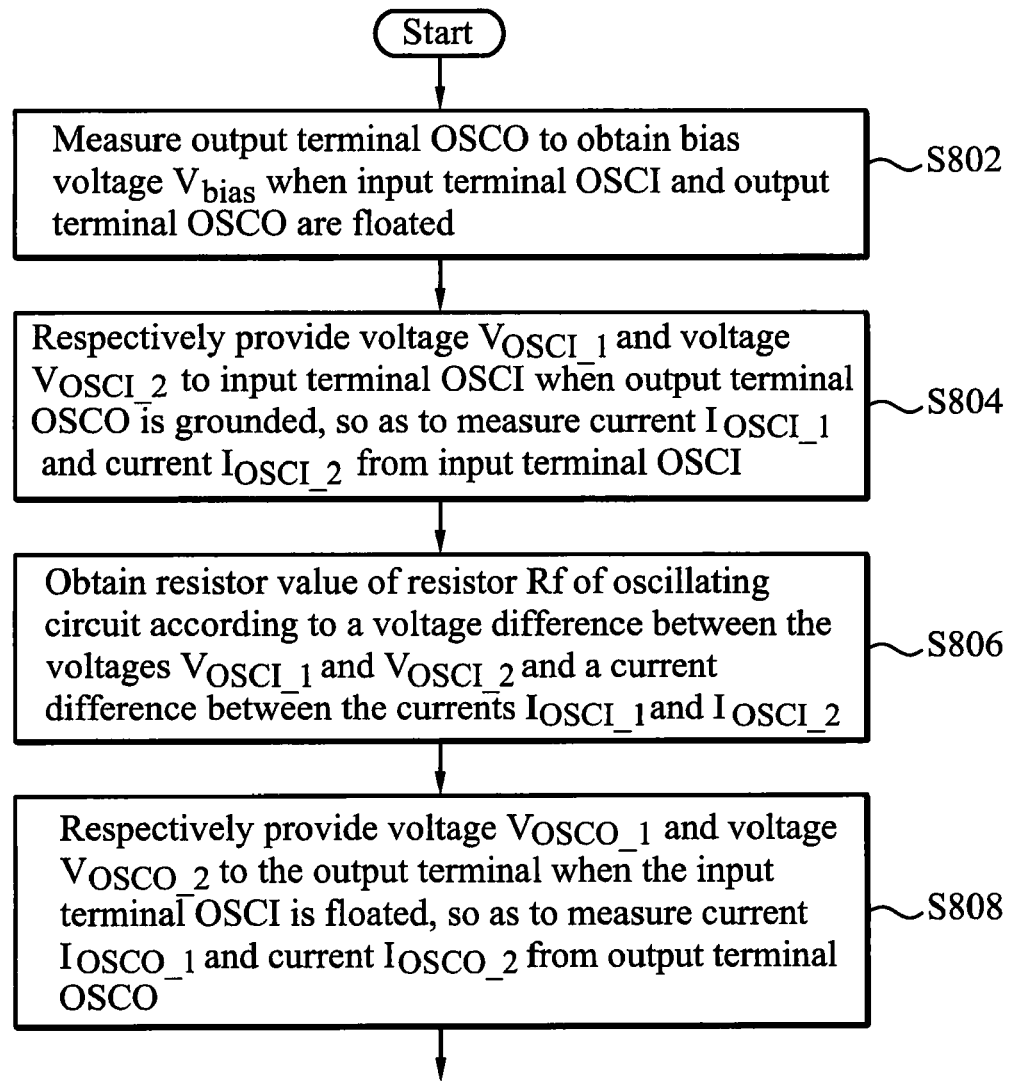
FIGS. 8A and 8B show another method for measuring transconductance of an oscillating circuit according to an embodiment of the invention.
Figure 8B:
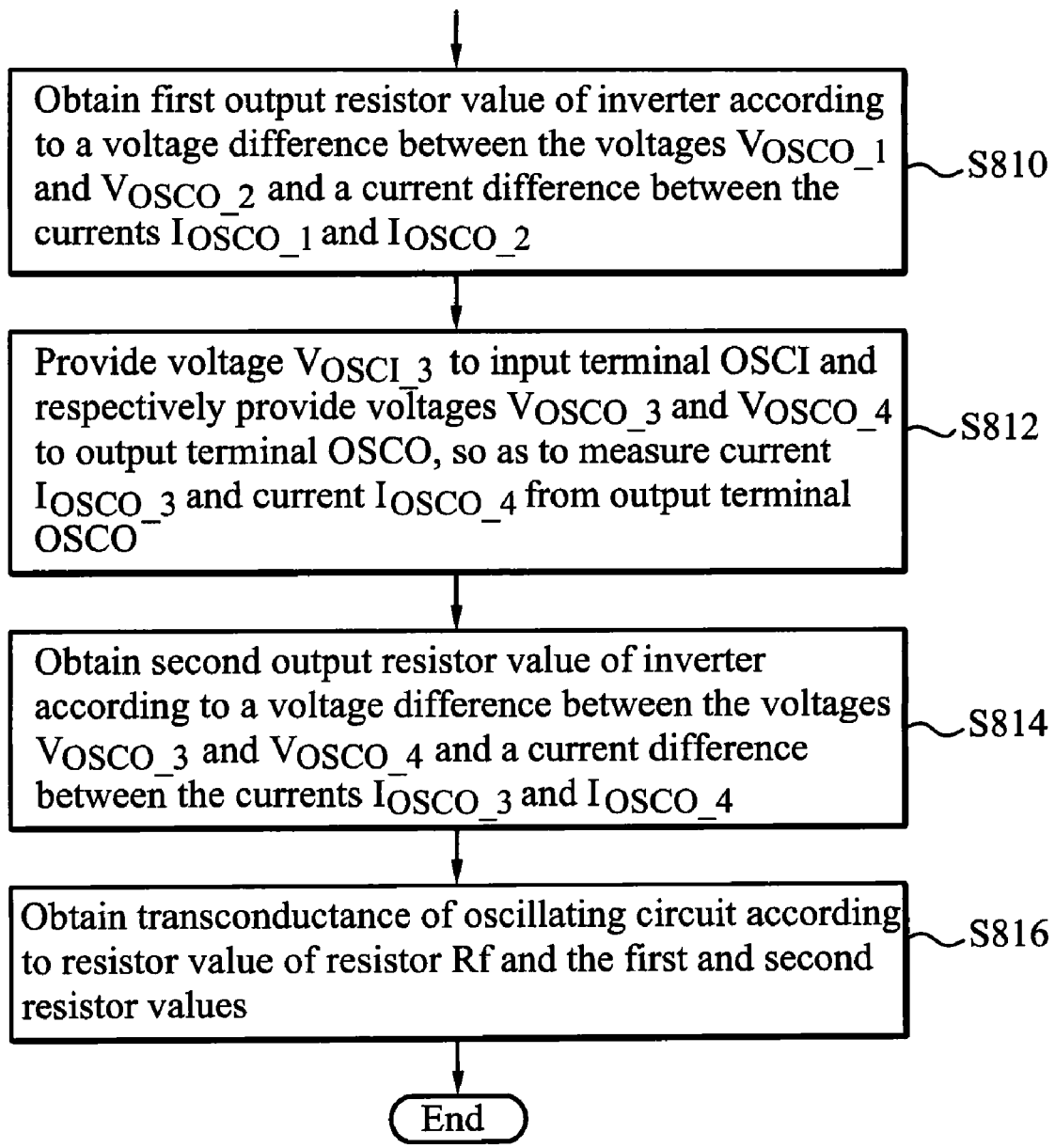

FIGS. 8A and 8B show another method for measuring transconductance of an oscillating circuit according to an embodiment of the invention, wherein the oscillating circuit comprises an inverter. First, in step S802, a bias voltage $V_{bias}$ of the oscillating circuit is obtained by floating an input terminal OSCI and an output terminal OSCO of the oscillating circuit and measuring the output terminal OSCO. Next, in step S804, by grounding the output terminal OSCO and respectively providing the voltages $V_{OSCI\_1}$ and $V_{OSCI\_2}$ to the input terminal OSCI, a current $I_{OSCI\_1}$ corresponding to the voltage $V_{OSCI\_1}$ and a current $I_{OSCI\_1}$ corresponding to the voltage $V_{OSCI\_2}$ are measured from the input terminal OSCI, as shown in FIG. 4A, wherein the voltage $V_{OSCI\_1}$ and the bias voltage $V_{bias}$ have the same voltage levels. Next, in step S806, a resistor value of a feedback resistor Rf of the oscillating circuit is obtained according to a voltage difference between the voltages $V_{OSCI\_1}$ and $V_{OSCI\_2}$ and a current difference between the currents $I_{OSCI\_1}$ and $I_{OSCI\_2}$, as shown in the equation (2). Next, in step S808, by floating the input terminal OSCI and respectively providing the voltages $V_{OSCO\_1}$ and $V_{OSCO\_2}$ to the output terminal OSCO, a current $I_{OSCO\_1}$ corresponding to the voltage $V_{OSCO\_1}$ and a current $I_{OSCO\_2}$ corresponding to the voltage $V_{OSCO\_2}$ are measured from the output terminal OSCO, as shown in FIG. 5A, wherein the voltage $V_{OSCO\_1}$ and the bias voltage $V_{bias}$ have the same voltage levels. Next, in step S810, a first output resistor value of the oscillating circuit is obtained according to a voltage difference between the voltages $V_{OSCO\_1}$ and $V_{OSCO\_2}$ and a current difference between the currents $I_{OSCO\_1}$ and $I_{OSCO\_2}$, as shown in the equation (3). Next, in step S812, by forcing a voltage $V_{OSCI\_3}$ to the input terminal OSC and respectively providing the voltages $V_{OSCO\_3}$ and $V_{OSCO\_4}$ to the output terminal OSCO, a current $I_{OSCO\_3}$ corresponding to the voltage $V_{OSCO\_3}$ and a current $I_{OSCO\_4}$ corresponding to the voltage $V_{OSCO\_4}$ are measured from the output terminal OSCO, as shown in FIG. 6A, wherein the voltages $V_{OSCI\_3}$ and $V_{OSCO\_3}$ and the bias voltage $V_{bias}$ have the same voltage levels. Next, in step S814, a second output resistor value of the oscillating circuit is obtained according to a voltage difference between the voltages $V_{OSCO\_3}$ and $V_{OSCO\_4}$ and a current difference between the currents $I_{OSCO\_3}$ and $I_{OSCO\_4}$, as shown in the equation (5). Next, in step S816, the transconductance of the oscillating circuit is obtained according to the resistor value of the feedback resistor Rf and the first and second output resistor values, as shown in equation (10).

The DC measuring method of the invention may measure transconductance parameter of an oscillating circuit which is implemented in an integrated circuit, thereby decreasing measuring time and testing cost.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method for measuring transconductance of an oscillating circuit, wherein the oscillating circuit comprises an inverter, comprising:

floating an input terminal and an output terminal of the inverter, and measuring the output terminal to obtain a bias voltage;

floating the input terminal and respectively providing a first voltage and a second voltage to the output terminal, so as to measure a first current corresponding to the first voltage and a second current corresponding to the second voltage from the output terminal, wherein the first voltage and the bias voltage have the same voltage levels;

obtaining an output resistor value of the inverter according to the first voltage, the second voltage, the first current and the second current; and obtaining the transconductance of the oscillating circuit according to the output resistor value.

2. The method as claimed in claim 1, wherein the output resistor value is obtained by dividing a voltage difference between the first voltage and the second voltage into a current difference between the first current and the second current.

3. The method as claimed in claim 1, wherein the transconductance of the oscillating circuit is equal to $$\frac{1}{Rout},$$

wherein Rout represents the output resistor value.

4. The method as claimed in claim 1, wherein the second voltage is generated according the bias voltage and a voltage difference, such that the second voltage is substantially close to the first voltage.

5. The method as claimed in claim 1, wherein the first voltage and the second voltage are the DC voltages.

6. The method as claimed in claim 1, wherein the transconductance of the oscillating circuit is equal to $$\frac{1}{\frac{1}{gmN} // \frac{1}{gmP}},$$

wherein gmN represents transconductance of an N type transistor of the oscillating circuit, and gmP represents transconductance of a P type transistor of the oscillating circuit.

7. A method for measuring transconductance of an oscillating circuit, wherein the oscillating circuit comprises an inverter with an input terminal and an output terminal and a resistor coupled between the input terminal and the output terminal, comprising:

floating the input terminal and the output terminal, and measuring the output terminal to obtain a bias voltage;

grounding the output terminal and respectively providing a first voltage and a second voltage to the input terminal, so as to measure a first current corresponding to the first voltage and a second current corresponding to the second voltage from the input terminal;

obtaining a resistor value of the resistor according to the first voltage, the second voltage, the first current and the second current;

floating the input terminal and respectively providing a third voltage and a fourth voltage to the output terminal, so as to measure a third current corresponding to the third voltage and a fourth current corresponding to the fourth voltage from the output terminal;

obtaining a first output resistor value of the inverter according to the third voltage, the fourth voltage, the third current and the fourth current;

providing a fifth voltage to the input terminal and respectively providing a sixth voltage and a seventh voltage to the output terminal, so as to measure a sixth current corresponding to the sixth voltage and a seventh current corresponding to the seventh voltage from the output terminal;

obtaining a second output resistor value of the inverter according to the sixth voltage, the seventh voltage, the sixth current and the seventh current; and obtaining the transconductance of the oscillating circuit according to the resistor value, the first output resistor value and the second output resistor value.

8. The method as claimed in claim 7, wherein the resistor value is obtained by dividing a voltage difference between the first voltage and the second voltage into a current difference between the first current and the second current.

9. The method as claimed in claim 7, wherein the first output resistor value is obtained by dividing a voltage difference between the third voltage and the fourth voltage into a current difference between the third current and the fourth current.

10. The method as claimed in claim 7, wherein the second output resistor value is obtained by dividing a voltage difference between the sixth voltage and the seventh voltage into a current difference between the sixth current and the seventh current.

11. The method as claimed in claim 7, wherein the transconductance of the oscillating circuit is equal to $$\frac{1}{\frac{1}{gmN} // \frac{1}{gmP}} = \frac{1}{Rout1},$$

wherein gmN represents transconductance of an N type transistor of the oscillating circuit, gmP represents transconductance of a P type transistor of the oscillating circuit, and Rout1 represents the first output resistor value.

12. The method as claimed in claim 7, wherein the transconductance of the oscillating circuit is equal to $$\frac{\frac{(Rf \times Rout2)}{Rf - Rout2} - Rout1}{\frac{Rf \times Rout2}{Rf - Rout2} \times Rout1},$$

wherein Rf represents the resistor value, Rout1 represents the first output resistor value, and Rout2 represents the second output resistor value.

13. The method as claimed in claim 7, wherein the first voltage and the bias voltage have the same voltage levels.

14. The method as claimed in claim 7, wherein the third voltage and the bias voltage have the same voltage levels.

15. The method as claimed in claim 7, wherein the fifth voltage and the bias voltage have the same voltage levels.

16. The method as claimed in claim 7, wherein the first voltage and the second voltage are the DC voltages.

* * * * *